(12) United States Patent
Ortega

(10) Patent No.: US 7,291,508 B2
(45) Date of Patent: Nov. 6, 2007

(54) LASER PROBE POINTS

(75) Inventor: Mel A. Ortega, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 271 days.

(21) Appl. No.: 10/403,620

(22) Filed: Mar. 31, 2003

(65) Prior Publication Data

US 2004/0189978 A1 Sep. 30, 2004

(51) Int. Cl.
*H01L 21/66* (2006.01)
(52) U.S. Cl. .................................................. 438/16
(58) Field of Classification Search ............ 438/14, 438/16; 250/559.27, 341.4; 356/437; 716/437; 324/753, 752
See application file for complete search history.

(56) References Cited

U.S. PATENT DOCUMENTS

| 5,872,360 A | 2/1999 | Paniccia et al. | 250/341.4 |
| 6,072,179 A * | 6/2000 | Paniccia et al. | 250/341.4 |
| 6,512,385 B1 * | 1/2003 | Pfaff et al. | 324/753 |

OTHER PUBLICATIONS

G.H. Massiha and T.M. Chen, Failure Detecting Technique of Laser-Induced Diode LInks1993, Electrical Engineering Department University of South Florida, pp. 1-3.*

G.H. Massiha and T.M. Chen, Failure Detecting Technique of Laser-Induced Diode Links 1993, Electrical Engineering Department University of South Florida, pp. 1-3.*

Runyon, "Optical System Probes Flip-Chips From Backside", EE Times, Sep. 30, 1998.

"IC Validation Alliance", Taiwan Semiconductor Manufacturing Company Ltd.

Perdu, "Characterization of Integrated Circuits for Space Applications with Pulsed Laser Beam", Grants Proposal 2003, Centre National d'Études Spatiales.

"IDS 2500", NP Test Inc., 2002.

"In-Circuit Measurements Overview", NP Test Inc., 2002.

"IDS Optica", NP Test Inc., 2002.

"IDS P3X—FIB System", NP Test Inc., 2002.

"Schlumberger Introduces IDS™ 2500, Next Generation Laser Probe System for Flip Chips", NPText: News & Events, Press Release, Sep. 6, 2002.

"Motorola Selects Optonics Emiscopetm-I for SOI Testing", Optonics Inc., 2002.

* cited by examiner

*Primary Examiner*—Carl Whitehead, Jr.
*Assistant Examiner*—Monica D. Harrison
(74) *Attorney, Agent, or Firm*—Trop, Pruner & Hu, P.C.

(57) ABSTRACT

A P-type diffusion diode is used as a probe point for an infrared laser probing system. The P-type diffusion diode probe point may be formed on a semiconductor substrate and connected to an integrated circuit thereon. The P-type diffusion diode probe point may result in higher signal-to-noise ratios in testing of integrated circuits at lower voltages.

13 Claims, 2 Drawing Sheets

LASER PROBE POINTS

BACKGROUND

This invention relates generally to semiconductor products and to methods for testing semiconductor products.

As device features and dimensions of integrated circuits continue to shrink, and increase in speed, there is a trend toward using flip chip technology when packaging complex high speed integrated circuits. In flip chip technology, also known as control collapse chip connection (C4) packaging, the integrated circuit is flipped upside down.

It is often necessary to probe electrical signals from internal nodes of the integrated circuit packaged in a flip chip or C4, packaging environment. For example, during the testing, debug or failure analysis process, internal nodes may be probed to obtain significant electrical and timing data from the integrated circuit. Such data include device parameters such as voltage levels, timing information, current levels and thermal information.

Access to the metal interconnects in an integrated circuit may be obstructed by the package substrate. The P-N junctions forming active and passive regions of an integrated circuit may be accessible, however, through the back side of the silicon substrate of an integrated circuit die using an infrared laser voltage probing system such as those offered by NPTest Inc. With such an infrared laser voltage probing system, a laser beam may be directed through the back side of the device under test (DUT), and reflected back to a detector. The detector detects waveforms which depend on the refractive index of different regions in the substrate. Detection is possible due to the plasma-optical effect in which the refractive index of a region of free charge is different from a region with no charge.

The nodes may be one or more probe points selected in an integrated circuit, onto which the infrared laser may be directed. For example, N-type diffusion devices, i.e., transistors, have been used as probe points. An N-type diffusion probe point may be an N-type impurity, i.e., a region having excess electron carriers, implanted within a P-type region in a substrate. N-type diffusion probe points may provide static protection during fabrication of an integrated circuit and typically use very small space on an integrated circuit.

However, as integrated circuits shrink, and voltages in those devices decrease, N-type diffusion probe points are less effective or ineffective for use with infrared laser voltage probing systems. For example, signal to noise ratios may be inadequate, particularly in circuits having small device geometries and/or low voltages, i.e., below about 1.5, volts.

What is needed is a probe point that is more effective for use with infrared laser voltage probing of integrated circuits. A method of testing integrated circuits with infrared laser voltage probing systems also is needed to provide better signal to noise ratios, for increasingly small geometry integrated circuits and low voltage devices.

DETAILED DESCRIPTION

Figure 1:
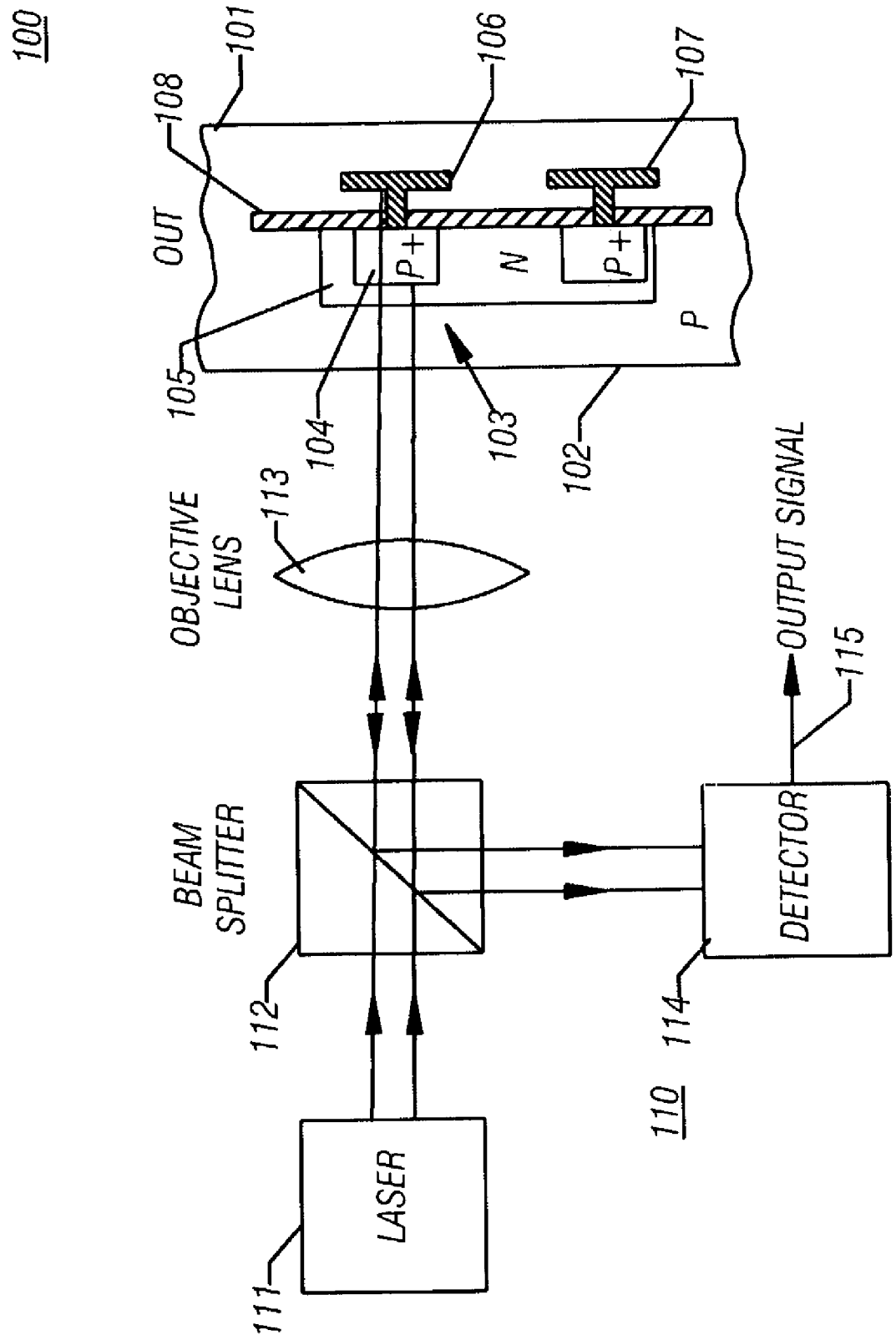
FIG. 1 is a diagram of an infrared laser probing system directed on a probe point according to an embodiment of the invention.

In FIG. 1, device under test (DUT) 100 is shown, which may include an integrated circuit or a portion thereof, formed on a wafer or substrate. DUT may be a CMOS integrated circuit disposed in silicon in a flip chip or C4, packaged product. In one embodiment, the DUT may be partially thinned to a thickness of less than about 200, μm before probing. Substrate 101 may be any surface, generated when making a semiconductor device, upon which an insulating layer may be formed. The substrate may include, for example, active and passive devices that are formed on a silicon wafer such as transistors, capacitors, resistors, diffused junctions, gate electrodes, local interconnects, etc. The substrate also may include insulating materials (e.g., silicon dioxide, either undoped or doped with phosphorus, (PSG) or boron and phosphorus (BPSG); silicon nitride; silicon oxynitride; silicon carbide; carbon doped oxide; or a polymer) that separate such active and passive devices from conductive layers that are formed on top of them, and may include various types of conductive layers.

The substrate has a back side 102 through which an infrared laser beam may be directed to probe point 103. The probe point is a P-type diffusion diode which may be connected to an integrated circuit. The P-type diffusion diode includes P-type diffusion region 104 contained by or formed within N-type well 105. The P-diffusion diode may be formed in the substrate by ion implantation, diffusion, and/or other techniques or processes known to those skilled in the art.

The substrate may consist of a P-type material. Within the P-type substrate, the N-type region is doped with N-type impurities, i.e., impurities having excess electron carriers. The P-type region is doped with P-type impurities, i.e., having excess holes. In one embodiment, the width W of the P-type diffusion diode is one micron or less, which may optimize signal amplification.

A power supply voltage may be connected to the integrated circuit to provide a voltage thereto of preferably less than about 1.5, volts, or, if desired, less than about 1.0, volts. In one embodiment, one or more contacts 106, 107 may be connected to the P-type region, through an insulating layer such as oxide film layer 108, for example. The contacts may provide metal interconnects through one or more layers of dielectric or other material layers formed on the substrate.

In accordance with the present invention, the P-type diffusion diode probe points may be used for test, debug and/or failure analysis. Electric fields and voltages may be measured by focusing an infrared laser voltage probe on a P-type diffusion diode probe point connected to a signal line in an integrated circuit. The infrared laser beam may be directed through the back side of the semiconductor substrate to one or more P-type diffusion diode probe points.

A silicon substrate is partially transparent to infrared light, so the infrared laser beam may be focused through that material and may be reflected back by a metal interconnect or contact. Or some of the laser beam may be reflected back by a dielectric material behind the P-type diffusion diode probe point and/or the interface between the dielectric and the P-type diffusion diode probe point.

Also shown in FIG. 1 is infrared laser voltage probe system 110 including laser 111, beam splitter 112, lens 113, and detector 114. The laser probe system is directed at device under test (DUT) 100 to make electrical and/or timing measurements of a signal line or interconnect on integrated circuits thereon. The laser beam generated by infrared laser 111 passes through beam splitter 112 and objective lens 113 which focuses the laser beam on probe point 103, and then is reflected back by contact/metal or other material behind the P-type diffusion diode probe point and passes back through the substrate. The reflected laser beam returns back through the objective lens and is guided into the detector through the beam splitter. The detector may generate an output signal 115 which corresponds to the electric field in the P-type diffusion diode probe point.

The detector may detect amplitude modulations in the reflected laser beam and may attribute the modulations in amplitude to the electric field in the P-type diffusion diode probe point. The infrared laser beam may be reflected from the metal contact and/or the interface between the oxide layer and P-type diffusion probe point. Electro-refraction and electro-absorption may combine to give an overall amplitude modulation in the reflected laser power to the detector. The modulation in the absorption of the laser beam is the signal of interest because it is related to the voltage applied to the P-type diffusion diode probe point. By operating the DUT while focusing the laser beam on the P-type diffusion diode probe point, electrical waveforms such as those shown in FIG. 2 may be generated which correspond to varying voltages applied to the probe point over time.

Figure 2:
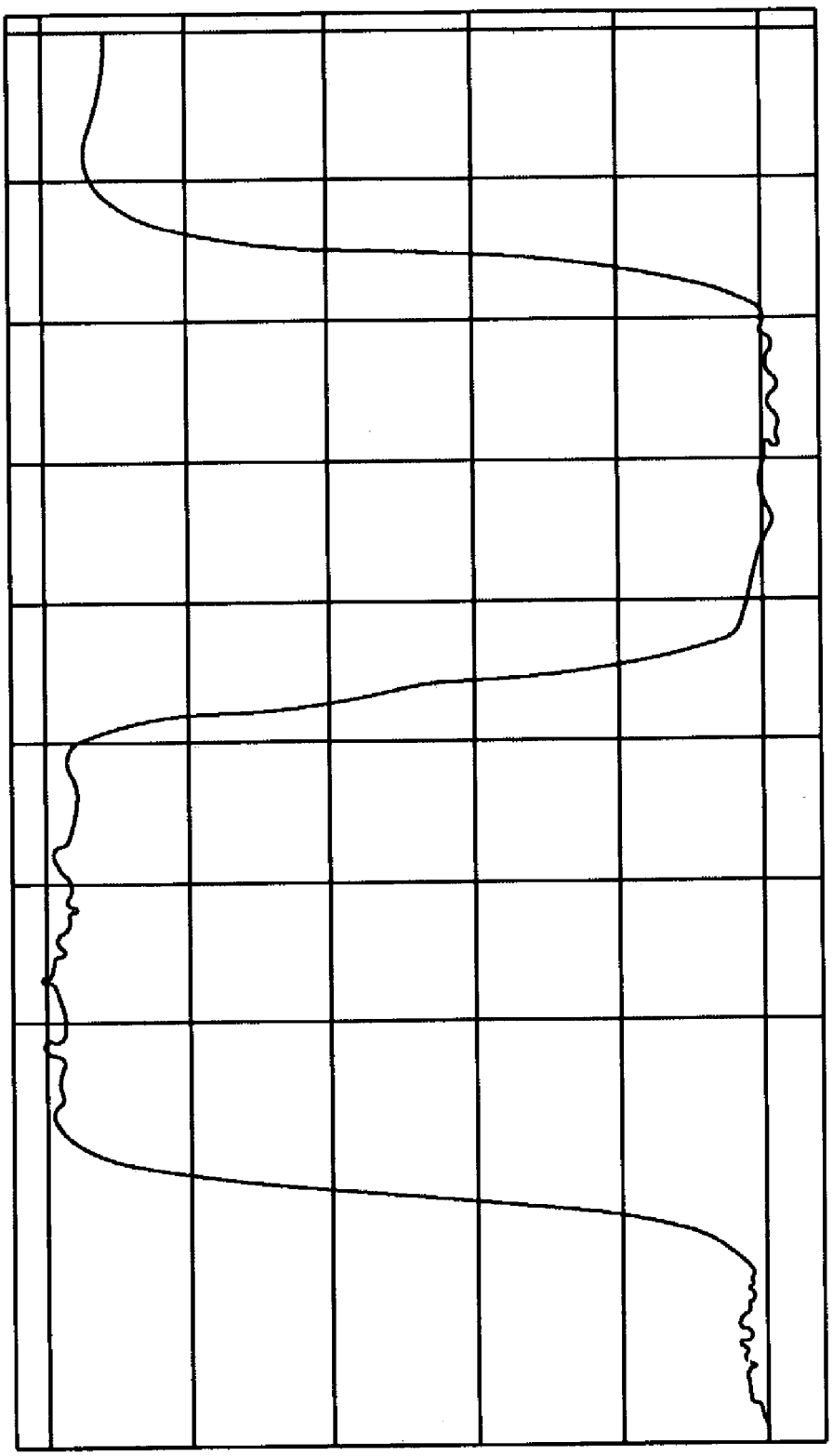
FIG. 2 is a graph illustrating a waveform that may be obtained using a P-diffusion diode probe point in one embodiment of the invention.

FIG. 2 is a graph illustrating plots of examples of waveforms that may be obtained while DUT is mounted and operating in a system environment. The voltage is shown as a function of time for each of the plots. The invention significantly increases the signal to noise ratio for these voltage signals, especially for smaller geometry integrated circuits.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   directing an infrared laser beam through the back of a semiconductor substrate to a P-type diffusion diode probe point, said P-type diffusion diode probe point including a P-type diffusion region formed within an N-type well;
   reflecting the infrared laser beam from the P-type diffusion diode probe point to a detector;
   applying a voltage of less than 1.5 volts to the P-type diffusion diode probe point; and
   providing an output signal indicative of changes in the electric field in the P-type diffusion diode.

2. The method of claim 1 further comprising directing the infrared laser beam through a beam splitter.

3. The method of claim 1 further comprising directing the infrared laser beam through an objective lens.

4. The method of claim 1 further comprising reflecting the infrared laser beam from a contact connected to the P-type diffusion diode probe point to a detector.

5. The method of claim 1 further comprising detecting amplitude modulations in the reflected laser beam.

6. An apparatus comprising:
   a substrate having an integrated circuit thereon and a P-type diffusion diode connected to the integrated circuit, said integrated circuit including a power supply for applying a voltage to the integrated circuit of less than about 1.5 volts, said P-type diffusion diode including a P-type diffusion region formed within an N-type well.

7. The apparatus of claim 6 wherein the P-type diffusion diode has a width of less than one micron.

8. The apparatus of claim 6 further comprising a power supply for applying a voltage to the integrated circuit of less than about 1 volt.

9. A method comprising:
   applying a voltage of less than 1.5 volts to a P-type diffusion diode, said P-type diffusion diode including a P-type diffusion region that is formed within an N-type well and connected to an integrated circuit on a semiconductor substrate; and
   detecting changes in the voltage in the P-type diffusion diode using an infrared laser voltage probing system.

10. The method of claim 9 further comprising applying a voltage of less than about 1.0 volts to the P-type diffusion diode connected to an integrated circuit.

11. The method of claim 9 further comprising detecting the amplitude of an infrared laser beam focused on the P-type diffusion diode.

12. The method of claim 9 further comprising amplifying the changes in the voltage.

13. The method of claim 9 wherein the P-type diffusion diode includes a P-type diffusion region that is formed within an N-type well.

* * * * *